United States Patent
Smith et al.

(10) Patent No.: US 7,332,795 B2
(45) Date of Patent: Feb. 19, 2008

(54) DIELECTRIC PASSIVATION FOR SEMICONDUCTOR DEVICES

(75) Inventors: Richard Peter Smith, Carrboro, NC (US); Scott T. Sheppard, Chapel Hill, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 89 days.

(21) Appl. No.: 10/851,507

(22) Filed: May 22, 2004

(65) Prior Publication Data
US 2005/0258431 A1  Nov. 24, 2005

(51) Int. Cl.
H01L 23/58 (2006.01)
H01L 21/31 (2006.01)

(52) U.S. Cl. ................................ 257/635; 438/779
(58) Field of Classification Search ............... 257/635, 257/615, 637–640; 438/779, 958
See application file for complete search history.

(56) References Cited

U.S. PATENT DOCUMENTS

| | | | |
|---|---|---|---|
| 5,057,897 A | 10/1991 | Nariani et al. | |
| 5,128,279 A | 7/1992 | Nariani et al. | |
| 5,192,987 A | 3/1993 | Khan et al. | |
| 5,223,458 A * | 6/1993 | Shanfield et al. | 438/761 |
| 5,296,395 A | 3/1994 | Khan et al. | |
| 6,060,734 A * | 5/2000 | Kunihiro | 257/284 |
| 6,242,327 B1 * | 6/2001 | Yokoyama et al. | 438/507 |
| 6,246,076 B1 | 6/2001 | Lipkin et al. | |
| 6,297,092 B1 | 10/2001 | Rudeck et al. | |
| 6,316,793 B1 | 11/2001 | Sheppard et al. | |
| 6,504,235 B2 * | 1/2003 | Schmitz et al. | 257/649 |
| 7,045,404 B2 * | 5/2006 | Sheppard et al. | 438/191 |
| 2001/0023964 A1 | 9/2001 | Wu et al. | |
| 2002/0066908 A1 | 6/2002 | Smith | |
| 2003/0020092 A1 | 1/2003 | Parikh et al. | |
| 2003/0102482 A1 | 6/2003 | Saxler | |
| 2004/0036086 A1 | 2/2004 | Khan et al. | |
| 2004/0070003 A1 | 4/2004 | Gaska et al. | |

FOREIGN PATENT DOCUMENTS

JP  2001085670  3/2001

(Continued)

OTHER PUBLICATIONS

X. Z. Dang et al., Influence of surface processing and passivation on carrier concentrations and transport properties in AlGaN/GaN heteroructures, J. Appl. Phys., vol. 90, No. 3, Aug. 1, 2001, pp. 1357-1361.

(Continued)

Primary Examiner—Mark V. Prenty
(74) Attorney, Agent, or Firm—Summa, Allan & Additon, P.A.

(57) ABSTRACT

A semiconductor device is disclosed that includes a layer of Group III nitride semiconductor material that includes at least one surface, a control contact on the surface for controlling the electrical response of the semiconductor material, a dielectric barrier layer covering at least a portion of the one surface adjacent the control contact, the dielectric barrier layer having a bandgap greater than the bandgap of the Group III nitride and a conduction band offset from the conduction band of the Group III nitride; and a dielectric protective layer covering the remainder of the Group III nitride surface.

49 Claims, 3 Drawing Sheets

FOREIGN PATENT DOCUMENTS

| | | |
|---|---|---|
| WO | WO 00/04587 A2 | 1/2000 |
| WO | WO 01/57929 A1 | 8/2001 |

OTHER PUBLICATIONS

M. Asif Khan et al., AlGan/GaN Metal Oxide Semiconductor Heterostructure Field Effect Transistor, IEEE Electron Device Letters, vol. 21, No. 2, Feb. 2000, pp. 63-65.

S. Yoshida et al., Improvement of Endurance to Hot Carrier Degradation by Hydrogen Blocking P-SiO, IEDM 88, pp. 22-25, IEEE 1988, Dec. 1988.

G. Simin et al., SiO2/AlGaN/InGaN/GaN MOSDHFETs, IEEE Electron Device Letters, vol. 23, No. 8, Aug. 2002, pp. 458-460.

Hu et al., Si3N4/AlGaN/GaN-Metal-Insulator-Semiconductor Heterostructure field-Effect Transistors, Applied Physics Letters, American Institute of Physics, vol. 79, No. 17, Oct. 22, 2001, pp. 2832-2834.

* cited by examiner

US 7,332,795 B2

DIELECTRIC PASSIVATION FOR SEMICONDUCTOR DEVICES

BACKGROUND OF THE INVENTION

The invention relates to passivation layers that protect semiconductor devices from hostile environmental conditions and help control electrical properties of the outer semiconductor layers of the devices. In particular, the invention pertains to protective layers of dielectric materials with appropriate physical properties to provide means for improving the surface quality and electrical performance of a semiconductor device.

The accumulation of charge carriers within energy states along the surface of the device and within the passivation layers themselves affects device performance in undesirable ways. Passivation layers are known to provide a dual benefit of helping to protect semiconductor surfaces against environmental contamination while also reducing the density of interface traps present at the surface of the material at which charge can accumulate.

Passivation layers, however, have the drawback of possibly interfering with the operation of the device. The protection offered by the passivation layer may be defeated by problems that the layers cause during operation. Over time, however, protective passivation layers have been designed using relatively thin oxide or nitride layers, or both, that have minimized or avoided detrimental effects on the performance of the device. Often, the passivation can even improve the performance of the device.

An example of a protective passivation layer is shown in U.S. Pat. No. 5,057,897 issued to Nariani et al. on Oct. 15, 1991. The Nariani patent states that "it is generally desired to protect the exposed metal with a passivation structure. Passivation structures including an oxide layer followed by a nitride layer have proved effective at protecting the underlying structure from environmental attack." Column 1, lines 53-57. The Nariani patent, however, is limited to protecting the device from outside elements and provides no additional control over the electro-chemical processes at work within the device itself.

More complex devices have brought forth a need for more sophisticated passivation layers. Protecting an overall device from outside elements is a worthy endeavor, but encapsulating a device with a passivation layer may not necessarily protect the device from undesired internal chemical or electrical interactions that can affect the electrical response within the device. Modern devices, therefore, require passivation layers that protect the device from chemical and electrical conditions within the device as well as protecting the device from any hostile outside environment. Simple encapsulation of certain devices with an oxide or nitride layer may be ineffective to provide sufficient environmental protection, device stability, and simultaneous optimization of performance.

Field effect transistors are typical semiconductor devices which can benefit from having a passivation layer. In a field effect transistor, a voltage applied to a control contact (called the "gate") determines the amount of charge in a conductive channel within the device, and thereby controls the amount of current that can flow in the channel. Current generally flows between source and drain contacts located at either end of the channel.

A small input signal applied to the gate may modulate a relatively large amount of current in the channel, resulting in signal amplification if an appropriate load is presented. If the control contact is a contact directly on the surface of the semiconductor, other mobile or trapped charges on or near the surfaces adjacent to the control contact of such devices can hinder proper modulation of the conductive channel by the control voltage.

A recurring problem in achieving the proper control bias is the presence of energy states at or near the intersection of the control contact and the semiconductor body. These energy states can occur on the surface of the device and within any passivation layer covering the device. Charge carriers can accumulate in these energy states to create surface charges on the semiconductor or buried charge within the passivation layer. The charged states significantly deteriorate performance of semiconductor devices by affecting the current flow in the conducting layer below the areas adjacent to the gate. Trapping occurs when charge carriers are caught in localized energy states that are present along the surface of the semiconductor device and within surface passivation layers. Charge carriers trapped within these energy states are problematic, as they affect the overall electrical characteristics of the device. For example, since electric charges give rise to electric fields, accumulated charge carriers may cause unwanted electric fields to be present in the semiconductor structure.

Trapping can occur when the charge carriers achieve high energy levels during device operation, or may even penetrate the passivation due to the high electric fields present in the device.

Under other theories, un-terminated chemical bonds at the surface of a high frequency device with a metal contact can create charged states on the surface. See U.S. Pat. No. 6,316,793 entitled "Nitride Based Transistors on Semi-insulating Silicon Carbide Substrates" issued to Sheppard, et al. on Nov. 13, 2001. These unterminated chemical bonds may trap a portion of the carriers that would otherwise flow in the channel of a field effect transistor, such as the two dimensional electron gas of a high electron mobility transistor (HEMT). The inventors do not wish to be bound by any of the theories presented herein and provide this discussion only as background material for this specification.

Preventing the problems caused by surface charges has been a goal for some time in the field of semiconductor electronics. The solutions presented to date have largely centered on applying a passivation layer upon the surface of the devices to prevent charge accumulation along these surfaces. Passivation techniques include coating the surface of semiconductor devices with a layer of material that reduces the ability of the semiconductor surface to trap carriers injected from the metal contact or from the semiconductor material itself.

Several groups reported as early as 1994 that silicon nitride passivation in the source-gate and gate-drain region reduces the degree of current collapse. The silicon nitride layer alone, however, could not diminish current collapse completely. See Simin et al., *SiO2/AlGaN/InGaN/GaN MOSDHFETs*, IEEE Electron Device Letters, Volume 23, No. 8, August 2002, pages 458-460.

Other researchers showed that a thin silicon dioxide ($SiO_2$) layer deposited on semiconductor devices reduced the density of interface traps along the surface and led to a corresponding reduction in surface charge. See Dang et al., *Influence of Surface Processing and Passivation on Carrier Concentrations and Transport Properties in AlGaN/GaN Heterostructures*, Journal of Applied Physics, Aug. 1, 2001, pages 1357-1360.

Experiments using silicon dioxide passivation layers have shown that semiconductor devices performed best when the silicon dioxide ($SiO_2$) layer was positioned between the metal contact and the semiconductor material. See Khan et al., *AlGaN/GaN Metal Oxide Semiconductor Heterostructure Field Effect Transistor*, IEEE Electron Device Letters, February 2000, pages 63-65. Placing a thin $SiO_2$ layer under a rectifying contact on a semiconductor device continued to be the focus of later research as well. See Simin et al., *SiO2/AlGaN/InGaN/GaN MOSDHFETs*, IEEE Electron Device Letters, Volume 23, No. 8, August 2002, pages 458-460. Simin et al. reported, however, that $SiO_2$ layer incorporation under the gate does not affect the mechanism responsible for current collapse in these devices.

Accordingly, more effective passivation structures are needed to provide improved device performance.

SUMMARY OF THE INVENTION

In one aspect, the invention is a semiconductor device comprising a layer of Group III nitride semiconductor material that includes at least one surface, a control contact on said surface for controlling the electrical response of said semiconductor material, a dielectric barrier layer covering at least a portion of said one surface adjacent said control contact, said dielectric barrier layer having a bandgap greater than the bandgap of said Group III nitride and a conduction band offset from the conduction band of said Group III nitride, and a dielectric protective layer covering the remainder of said Group III nitride surface.

In another aspect the invention is a semiconductor device comprising a layer of Group III nitride semiconductor material that includes at least one surface, a control contact on said surface for controlling the electrical response of said semiconductor material, a silicon dioxide barrier layer covering at least a portion of said one surface adjacent said control contact, for providing a bandgap greater than the bandgap of said Group III nitride and a conduction band offset from the conduction band of said Group III nitride, and a silicon nitride protective layer covering the remainder of said Group III nitride surface for providing a physical and chemical barrier against moisture, oxygen and related environmental attack.

In another aspect the invention is a semiconductor device comprising a layer of Group III nitride semiconductor material that includes at least one surface, a control contact on said surface for controlling the electrical response of said semiconductor material, a silicon dioxide barrier layer covering at least a portion of said one surface adjacent said control contact, said dielectric barrier layer having a bandgap greater than the bandgap of said Group III nitride and a conduction band offset from the conduction band of said Group III nitride, a silicon nitride protective layer covering the remainder of said Group III nitride surface for providing a physical and chemical barrier against moisture, oxygen and related environmental attack, and a spacer layer interposed between said Group III nitride surface and said silicon dioxide barrier layer for physically protecting said Group III nitride surface and for reducing surface charge accumulation.

In another aspect the invention is a method of passivating a Group III nitride semiconductor device. In this aspect, the invention comprises forming a dielectric barrier layer on the Group III nitride surface of a semiconductor device from a material having a bandgap greater than the bandgap of the Group III nitride and a conduction band offset from the conduction band of the Group III nitride to at least partially cover any exposed Group III nitride material on the surface, and forming a protective layer on said barrier layer from a dielectric material that also provides a physical and chemical barrier against moisture and oxygen.

The foregoing and other objects and advantages of the invention and the manner in which the same are accomplished will become clearer based on the followed detailed description taken in conjunction with the accompanying drawings.

DETAILED DESCRIPTION

Figure 1:
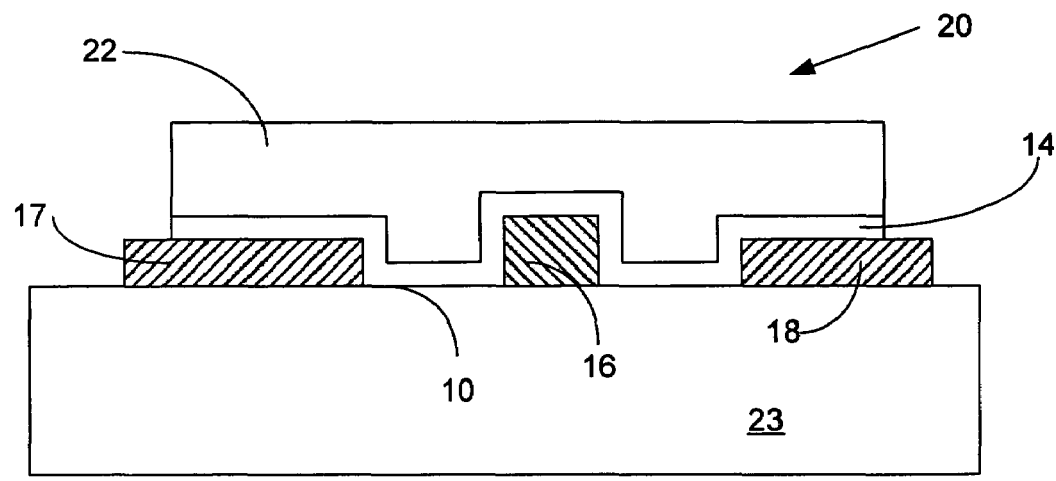
FIG. 1 is a cross sectional view of a semiconductor device precursor with a passivation layer on a charge barrier layer according to embodiments of the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions or layers may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

The invention described herein provides a passivation structure for reducing trapped charge at or near the surface of Group III nitride semiconductor devices. Trapped charge may occur along the surface of a device near the intersection of the semiconductor material and the contacts, or charges may accumulate within energy states present in a passivation layer adjacent the surface. These trapped charges on or near the surface interfere with the desired performance of the device because trapped charge distorts the effects of other signals appropriately applied to the device.

Group III nitride devices are generally well-understood in this art and are based on the wide-bandgap and direct transition characteristics of the Group III nitride compounds. Those familiar with this art are well aware that the term "Group III nitride" is generally used—and will be used in the present context—to refer to compositions of gallium (Ga), aluminum (Al) and indium (In) with nitrogen in binary, ternary and quaternary combinations. Generally speaking, in such compounds the sum of the Group III atomic fractions is equal to the atomic fraction of nitrogen; e.g., $Al_xGa_yN$, where x+y=1. Given this understanding, the possible formulas and specific properties of the various Group III nitrides will not be discussed herein other than as necessary to describe certain embodiments of the invention.

The present invention is exceptionally useful in Group III nitride-based field effect transistors that operate at high frequencies and yield a high power output. Carriers within field effect transistors operating at these relatively high voltages gain significant energy. Carriers that gain enough energy may be able to cross the bandgap of the semiconductor body, injecting themselves onto the surface of the device or even into a passivation layer on the surface. This phenomenon is known as hot-carrier injection. The high-energy (i.e. "hot") carriers readily fill available energy states within the passivation layer and cause an undesirable charge accumulation. The effect of charging of the passivation in short-channel field effect devices is cumulative and problematic. In particular, the threshold voltage and transconductance characteristics of a field effect device can change over time due to such charging.

A first embodiment of the invention is illustrated in FIG. 1 and includes a semiconductor device precursor structure 20 based upon a Group III nitride portion (substrate or epilayer) 23. The semiconductor device precursor 20 has at least one electrical contact 16 on its surface 10 with one of the electrical contacts essentially controlling the electrical behavior of the underlying Group III nitride material. For this specification, the inventors refer to this primary contact 16 as the control or gate contact. This terminology is for convenience of discussion only and is not intended to limit the nature of the invention herein. The electrical response of the semiconductor includes, but is not limited to, overall current flow, carrier flow and recombination, voltage response, and any other electrical variations within the semiconductor that are well known in the art of semiconductor electronics.

In addition to a gate contact 16, the structure 20 illustrated in FIG. 1 includes a source contact 18 and a drain contact 17 in contact with the surface 10 of the Group III nitride 23. In operation, electrical charge carriers flow from the source contact 18 through the channel region beneath the gate contact 16 to the drain contact 17.

In some embodiments, the invention reduces the accumulation of charge carriers at or near the surface 10 of the Group III nitride 23 by reducing the likelihood that mobile carriers will be injected into the protective passivation layer 22 on the surface. This is accomplished by providing a dielectric charge barrier layer 14 on portions of the surface 10 of the semiconductor precursor 20 adjacent the gate contact 16. The charge barrier layer may be formed on portions of the surface 10 between gate 16 and source 18 or between gate 16 and drain 17 or both. In the embodiment illustrated in FIG. 1 the charge barrier layer 14 covers the majority of the surface 10 of the structure 20, and in some embodiments the charge barrier layer 14 may cover the entire surface 10 of the structure 20. In some embodiments, the charge barrier layer 14 may additionally cover portions of one or more of the electrical contacts 16, 17, 18 on the surface of the structure 20.

Figure 6:
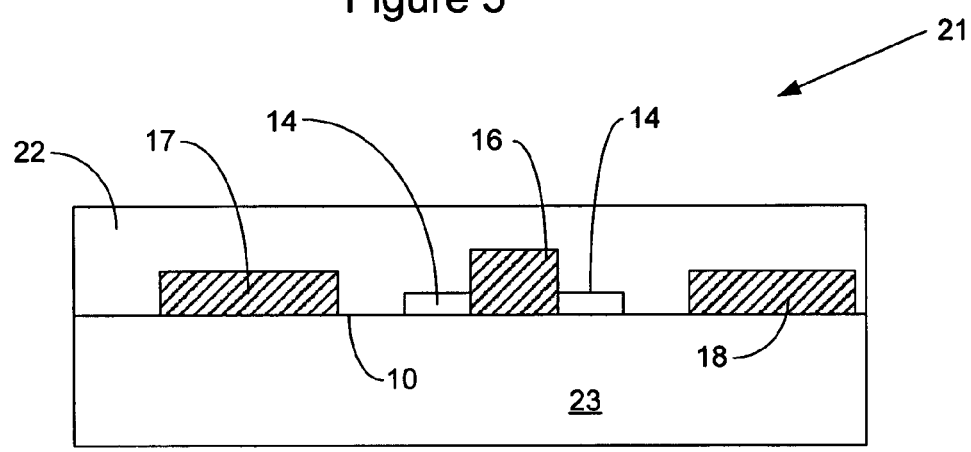
FIG. 6 is a cross sectional view of another embodiment of the present invention.

FIG. 6 illustrates an embodiment 21 analogous to FIG. 1, but in which the charge barrier layer 14 covers a portion, but not all, of the surface 10 adjacent the gate contact 16 extending toward the source contact 18, and in which the charge barrier layer 14 also covers a portion, but not all, of the surface 10 adjacent the gate contact 16 extending toward the drain contact 17. The charge barrier layer 14 should be present in areas in which there are large electric fields which are capable of imparting sufficient energy to carriers to enable them to surmount the energy barrier presented by the protective layer 22. Accordingly, it may be particularly important for the charge barrier layer 14 to extend along the drain-side edge of the gate 16. In some embodiments, the charge barrier layer 14 may extend along the drain-side edge of the gate contact 16 for a distance of between about 0.25 and 5 microns. The charge barrier layer 14 may extend along the source-side edge of the gate contact 16 for a distance of between about 0.25 and 2 microns. In some embodiments, the charge barrier layer may extend the entire distance between gate contact 16 and source contact 18. Similarly, in some embodiments, the charge barrier layer may extend the entire distance between gate contact 16 and drain contact 17.

The charge barrier layer 14 of the instant invention has a bandgap energy that is relatively larger than the bandgap of protective layer 22, and preferably has a conduction band offset from the conduction band of the Group III nitride. The larger (and offset) bandgap of the charge barrier layer 14 provides a barrier to the injection of charge carriers into the protective layer 22. The charge barrier layer 14, therefore, helps to reduce the accumulation of charge carriers within the protective layer 22. The relatively larger bandgap of charge barrier layer 14 may also have an inhibiting effect on the accumulation of surface charge within interface traps near the surface 10. Since the wave functions of any mobile charges cannot penetrate as much into the charge barrier layer 14 as into the protective layer 22, the amplitude of the wave function should be smaller at the surface 10 beneath the charge barrier layer 14. Stated differently, the presence of charge barrier layer 14 may discourage mobile carriers from becoming trapped in interface states on or near the surface 10.

One dielectric material with a sufficient bandgap to prevent the accumulation of charge carriers on the semiconductor material is silicon dioxide ($SiO_2$). Silicon dioxide has a bandgap of up to 9 eV, making it an excellent insulator, and a good choice of material for the charge barrier layer 14. The bandgap of silicon dioxide is useful to prevent charge carriers from penetrating the charge barrier layer 14.

Another choice material for fabricating the charge barrier layer is silicon oxynitride ($Si_xO_yN_z$). Silicon oxynitride has a bandgap of 5 eV to 8 eV, depending on the atomic ratios of silicon, oxygen, and nitrogen in the film. This bandgap is sufficient to prevent charge carriers from crossing the silicon oxynitride barrier and accumulating in energy states at or near the surface of the device or within the silicon oxynitride passivation layer. Aluminum nitride (AlN), which has a bandgap of 6.2 eV, may also be used for the charge barrier layer.

The embodiment of FIG. 1 also includes a dielectric protective layer 22 covering the charge barrier layer 14 in its entirety. In addition to passivating the exposed surfaces of structure 20, the protective layer 22 may prevent ion diffusion from adversely affecting the performance of the semiconductor device. In this sense, the protective layer 22 acts to protect the semiconductor precursor 20 and the charge barrier layer 14 from a hostile outside environment. The protective layer 22 is therefore rugged in its ability to withstand environmental conditions, particularly undesired exposure to (and thus potential reaction with) moisture and oxygen.

In the first embodiment, silicon nitride is used as the protective layer 22 on top of the charge barrier layer 14. Silicon nitride ($Si_3N_4$) is a rugged insulator with bandgap energy of approximately 5 eV. Silicon nitride has the physical qualities that make it a suitable choice for passivation of an electronic device to protect the device from a hostile environment, particularly moisture and oxygen) and to prevent ion diffusion from interfering with device operation. Throughout this detailed description, various stoichiometries near $Si_3N_4$ will be referred to as silicon nitride despite the fact that the stoichiometry may actually deviate intentionally from the ratio implied by that nomenclature. The protective layer 22 may have a thickness of between about 100 and 2000 nm. In particular, the protective layer 22 may have a thickness of about 400 nm.

In this regard, although silicon nitride and the related compounds disclosed herein are highly suitable and preferred for the protective layer, they are not exclusive. Other materials that can provide both dielectric and environmental protective properties can include certain polymers as well as semiconductor materials that have semi-insulating properties (e.g. based on the manner in which they are doped, deposited or other such factors).

The embodiment depicted schematically in FIG. 1 includes a charge barrier layer 14 that is much thinner than the protective layer 22. This dimensional difference is consistent with the respective purpose of each layer. The charge barrier layer 14 is made of a high (wide) bandgap material, and the charge barrier layer must be thick enough for proper prevention of carrier accumulation near the surface 10 of the semiconductor and thin enough to facilitate a simple fabrication. The protective layer 22, however, is much thicker than the charge barrier layer due to its exposure to environmental conditions and its purpose of preventing ion diffusion.

The charge barrier layer 14 may be between about 5 and 200 nanometers in thickness. In some embodiments, the charge barrier layer is about 100 nanometers thick. The charge barrier layer 14 is deposited on the semiconductor 20 to its desired thickness by conventional means, including plasma-enhanced chemical vapor deposition, low pressure chemical vapor deposition, or sputtering.

In general, silicon dioxide has a lower dielectric constant than silicon nitride. For a passivation layer, a lower dielectric constant means that there is less capacitive coupling between contacts, or between the sidewalls of contacts and the semiconductor. This capacitive coupling is usually detrimental to the operation of the device, so the use of oxide may be preferable to silicon nitride. In other words, it may be better to have an oxide charge barrier layer 14 that is sufficiently thick to keep the parasitic capacitances low, while keeping the silicon nitride protective layer 22 just thick enough to provide a sufficient environmental barrier.

Figure 2:
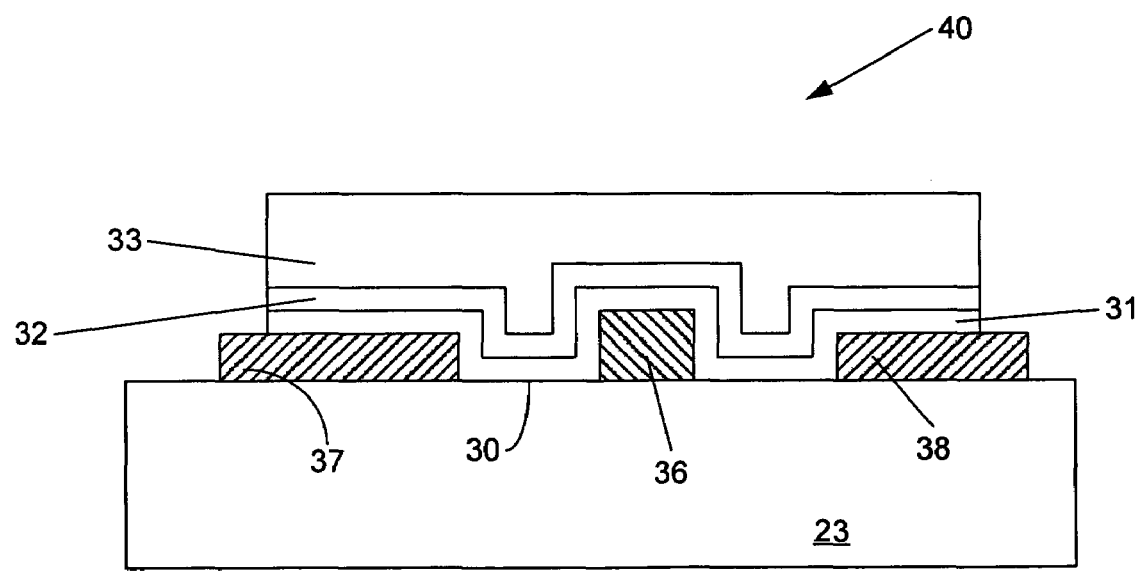
FIG. 2 is a cross sectional view of a semiconductor device precursor with a spacer layer between a charge barrier layer and the surface of the device according to embodiments of the present invention.
Figure 7:
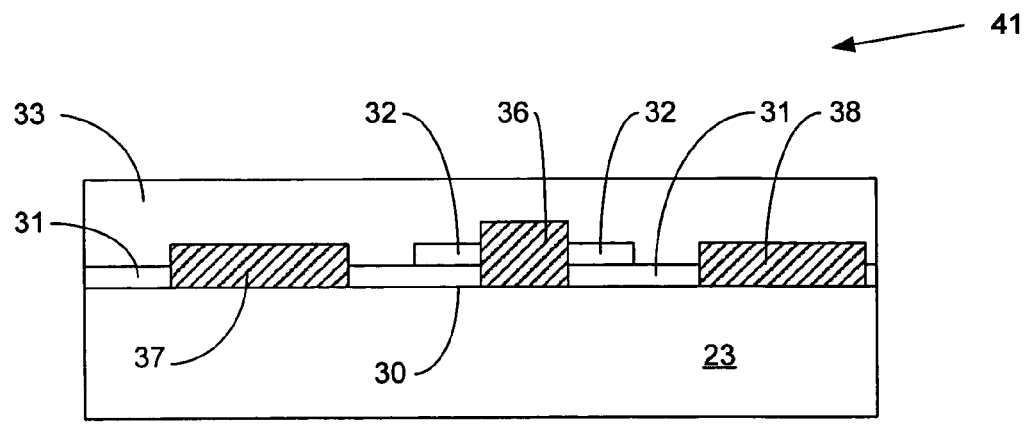
FIG. 7 is a cross sectional view of yet another embodiment of the present invention.

In another embodiment schematically illustrated in FIGS. 2 and 7, respective structures 40 and 41 include a charge barrier layer 32 and a protective layer 33 with the properties described in the embodiment described above. The embodiments of FIGS. 2 and 7 further include a spacer layer 31 on the surface 30 of the Group III nitride 23 under the charge barrier layer 32. The spacer layer 31 fully covers the remaining exposed surface of said semiconductor precursor 40. As illustrated in FIG. 2, the spacer layer 31 may cover at least a portion of at least one electrical contact 36, 37, 38. In some embodiments, the spacer layer 31 may cover the control contact 36 in its entirety and may partially cover any other contacts, such as ohmic contacts 37, 38 on the semiconductor surface 30. The spacer layer 31 may be applied to the surface 30 as early as possible in the semiconductor fabrication process in order to protect the surface. In some embodiments, the spacer layer is applied to surface 30 after growth of the upper semiconductor layer of the structure 40 before any metallization steps.

Expressed in a broader sense, an appropriate spacer layer 31 (or its equivalent in other embodiments) can help minimize or avoid any disadvantages that may arise when placing an oxide directly on the Group III nitride surface of a device, and does so without otherwise adversely affecting the device or the advantages provided by the invention.

In these embodiments, the charge barrier layer 32 is formed on the spacer layer 31. The protective layer 33 is then formed on the charge barrier layer 32 and covers the charge barrier layer 32 in its entirety.

The spacer layer 31 is particularly useful for preventing degradation of the semiconductor surface 30 during device fabrication. The surface 30 of the semiconductor precursor 40 is subject to temperature changes and physical stress during the addition of the passivation layers, including the charge barrier layer 32 and the protective layer 33. The spacer layer 31 protects the semiconductor surface 30 and ensures a better operation of the uppermost semiconductor layer of the overall device.

The invention herein prevents surface charge and simultaneously prevents charge within the passivation layers. The spacer layer 31 may be particularly helpful in reducing surface charge accumulation, and the charge barrier layer has bandgap properties that help prevent undesirable charges in the passivation layers. The spacer layer and the charge barrier layer described herein, either alone or in combination, provide protection against charge accumulation along the surface and within the passivation layers thereon.

The spacer layer 31 depicted in FIGS. 2 and 7 may be made of silicon nitride and various stoichiometric variations of the formula $Si_xN_y$. The spacer layer 31 may also be made of aluminum nitride or aluminum gallium nitride. Interfaces between these compounds and the GaN or AlGaN semiconductor surface may be higher-quality interfaces that have fewer electronic states than oxide-containing compounds. Accordingly, the quantity of charge accumulated in interface traps may be reduced by the presence of spacer layer 31.

As in the first embodiment, the charge barrier layer 32 may be formed of silicon dioxide or silicon oxynitride. These compositions have the bandgap properties to protect against charge carriers accumulating in energy states within the passivation layers themselves. The protective layer 33, which preferably comprises silicon nitride, may protect against ion diffusion into the semiconductor material.

The spacer layer 31 may be extremely thin and still provide a protective coating to the semiconductor surface in accordance with the invention. The charge barrier layer 32 and the protective layer 33 may, therefore, be much thicker than the spacer layer 31. The protective layer 33 may be much thicker than the charge barrier layer 32. The layers are shown schematically in FIGS. 2 and 7, and actual devices would have the relative thicknesses described above. In preferred embodiments, the charge barrier layer 32 may have a thickness that is between about 5 and 200 nanometers. In specific embodiments, the charge barrier layer 32 may be 100 nm thick. The spacer layer 31 may have a thickness between about 0.5 and about 5 nanometers.

FIG. 2 illustrates that in a manner analogous to FIG. 1, the space layer 31 and barrier layer 14, 32 can cover most or all of the surface 10, 30 of the Group III nitride semiconductor. FIG. 7 is analogous to FIG. 6 in illustrating that the barrier layer 14, 32 can be limited to covering portions of the surface 10, 30 adjacent the control contact 16, 36.

One type of field effect transistor of particular importance is the high electron mobility transistor (HEMT). An HEMT includes at least two layered components—a wide bandgap layered component and a narrower bandgap layered component. The interface of these two layered components with different bandgap properties can result in a current-carrying channel in the form of a two dimensional electron gas (2DEG) between the components. The current-carrying channel occurs within the unintentionally or lightly doped narrower bandgap component, while the wider bandgap of the first component tends to prevent the carriers from entering the first layered region. The gate contact of a HEMT is critical for proper operation in that an input signal on the gate can modulate the conductive channel in the two dimensional electron gas (2DEG). In this manner, the drain carries a current that is controlled in accordance with a bias voltage applied to the gate.

Many variants of HEMT designs are possible. One HEMT of particular interest includes a lightly doped or unintentionally doped gallium nitride (GaN) lower layer, a wider bandgap aluminum gallium nitride (AlGaN) upper layer on the GaN layer, a gate contact on the top surface, and two ohmic contacts, the source and the drain, to the current-carrying channel. In this embodiment, the two dimensional electron gas occurs in the lower layer at the interface with the upper layer. Ideally, the wider bandgap AlGaN layer keeps the carriers confined within the lower bandgap GaN layer.

The HEMT, however, could have other compositions that yield two dimensional electron gas channels. The wide bandgap region and the narrow bandgap region may include multiple layers of various Group III-V semiconductor alloys to achieve better electronic characteristics.

The narrow bandgap region, sometimes referred to as the channel region of a HEMT, may include a layer of GaN, thin layers of indium-gallium-nitride (InGaN), layers of GaN on AlGaN, and other combinations of Group III-V semiconductors. The wide bandgap region could include multiple layers of AlGaN or even thin layers of pure aluminum nitride (AlN). Pure GaN at the top surface is also another enhancement to be considered in HEMT design, depending on the use at hand.

Finally, an inverted HEMT is also useful and includes a narrow bandgap Group III-V semiconductor alloy region directly under the gate contact with a wider bandgap region underneath. This arrangement in an inverted HEMT yields a 2DEG that is closer to the gate, increases gate capacitance, and increases device transconductance. See Sze, Modern Semiconductor Device Physics, 1998, pages 104-107. The wide bandgap and narrow bandgap regions of an inverted HEMT may include many of the compositional layers described above.

Various types of semiconductor devices may benefit from passivation layers that limit carrier trapping and hot carrier injection effects at the device surface. As noted above, the invention is especially adaptable to field effect transistors but is not limited to such. Although the invented passivation structure is widely applicable in the field of semiconductor electronics, the passivation is particularly useful for enhancing the performance of high electron mobility transistors. The nature of a HEMT is such that the carriers therein attain high energy levels in response to the electric fields present during HEMT operation. The passivation structure described and claimed herein is of significant value in controlling hot electron injection in the multitude of HEMT designs prevalent today.

The inventors do not wish to limit the range of applications in which the disclosed passivation structure may be useful. Rather, the inventors choose to give detailed descriptions of the passivation structure in the context of the HEMT because the HEMT is one extremely practical application of the invention claimed herein. In order to illustrate the practicality of the claimed passivation structure, the inventors illustrate the invention in the context of a HEMT in which the relatively narrower bandgap channel region is composed of GaN, and the relatively wider bandgap region is composed of AlGaN. Other layer compositions for each region are equally encompassed within the scope of the invention herein, as the compositions described in detail below are for explanatory purposes and not intended to limit the scope of the invention.

Figure 3:
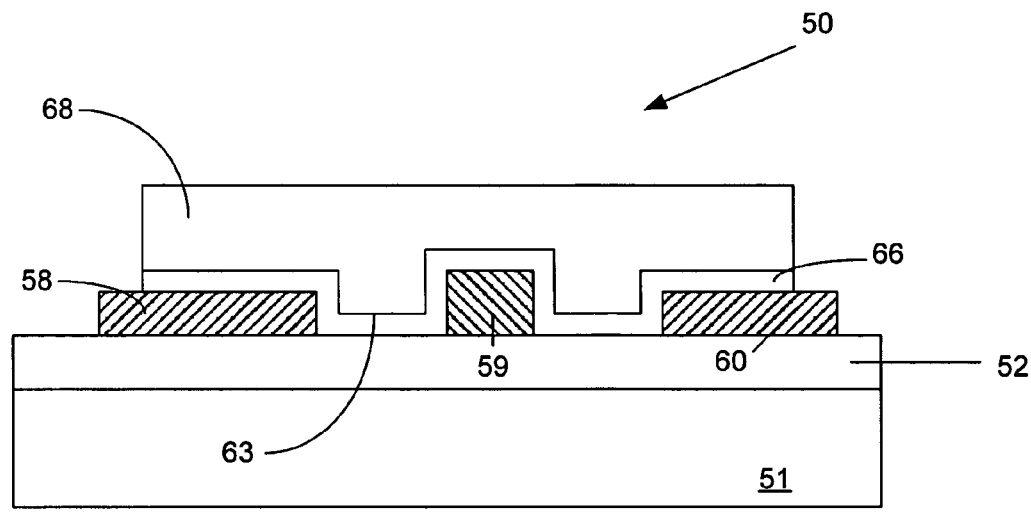
FIG. 3 is a cross sectional view of a field effect transistor formed in a layer of AlGaN on a layer of GaN with an charge barrier layer and a passivation layer according to embodiments of the present invention.

Further embodiments of the invention are illustrated in FIG. 3. FIG. 3 shows a field effect transistor 50 capable of operating at high frequencies and yielding high power output, comprising a gallium nitride (GaN) layer 51, an aluminum gallium nitride (AlGaN) layer 52 on the gallium nitride (GaN) layer 51, and respective source 58, drain 60, and gate contacts 59 on the surface of the aluminum gallium nitride (AlGaN) layer 52. As in the prior embodiments, the field effect transistor 50 of FIG. 3 includes a protective layer 68 which protects the device from ion diffusion and from moisture and oxygen in harsh environments.

In an ordinary field effect transistor, electrons may become trapped at the surface 63 of the AlGaN layer 52. To prevent this accumulation of electrical charge on the surface 63 of the AlGaN layer 52, the structure 50 includes a charge barrier layer 66. In the embodiments illustrated in FIG. 3, the charge barrier layer 66 covers a portion of the source and drain contacts 58, 60 respectively, and the charge barrier layer 66 covers the gate contact 59 and semiconductor material exposed at AlGaN surface 63. It will be understood, however, that the charge barrier layer need not cover the entire exposed surface 63 of the AlGaN layer 52, nor does it have to cover any part of the electric contacts thereon.

The charge barrier layer 66 has a bandgap that is relatively larger than the bandgap of protective layer 68 to reduce the injection of electrons into protective layer 68. In the embodiments shown in FIG. 3, the protective layer 68 covers the charge barrier layer 66 in its entirety.

As in the prior embodiments, the charge barrier layer 66 is preferably made of silicon dioxide, and the protective layer 68 comprises silicon nitride of the formula $Si_xN_y$. The charge barrier layer 66 of the field effect transistor 50 is thinner than the protective layer 68 with the charge barrier layer having a thickness that is less than about 100 nanometers. The $SiO_2$ charge barrier layer 66 is deposited by a method selected from the group consisting of plasma-enhanced chemical vapor deposition, low pressure chemical vapor deposition, and sputtering. The $Si_xN_y$ protective layer 68 may be deposited by plasma-enhanced chemical vapor deposition, low pressure chemical vapor deposition, or other conventional means.

In an alternative embodiment, the charge barrier layer 66 may be made of silicon oxynitride.

The field effect transistor 50 of FIG. 3 may be a high electron mobility transistor (HEMT) formed in the AlGaN and GaN layers. An HEMT is useful for high power output at high frequencies in the microwave band.

Surface charge on the AlGaN layer 52 or in the passivation layers on the AlGaN may interfere with the proper operation of an HEMT. The accumulation of electrons on or near the AlGaN surface 63 may present a negative bias that depletes the conductive channel in the two dimensional electron gas and leads to current collapse in the source-drain current. The states that accumulate this charge typically have slower response times than the gate and the channel. The slow response time results in an average electron accumulation on the surface of the semiconductor, therefore, that interferes with the ability of the bias of the signal on the gate 59 to control the current to the drain 60. The invention herein may reduce this accumulation of electrons on the surface of an HEMT and result in a better performing transistor.

Figure 4:
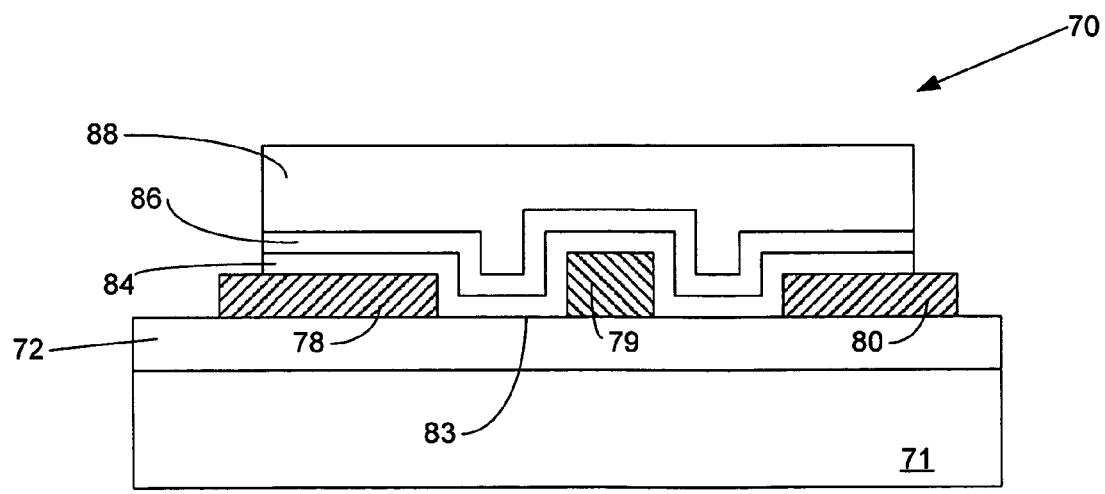
FIG. 4 is a cross sectional view of a field effect transistor formed in a layer of AlGaN on a layer of GaN with an charge barrier layer, a spacer layer, and a passivation layer according to embodiments of the present invention.

FIG. 4 illustrates a further embodiment of the invention that includes the spacer layer 84 as described above covering a portion of the source 78 and drain 80 contacts of a field effect transistor 70 formed in a layer of AlGaN 72 on a layer of GaN 71. The transistor 70 is preferably an HEMT as described above. In the embodiments illustrated in FIG. 4, the spacer layer 84 completely covers the gate contact 79 and the semiconductor material 83 exposed at the surface of the AlGaN layer 72. It will be understood, however, that the spacer layer 84 need not cover the contacts 78, 79, 80.

The spacer layer 84 protects the surface of the AlGaN layer 72 during the fabrication of the upper passivation layers 86, 88. This embodiment includes the charge barrier layer 86 entirely encapsulating the spacer layer 84 by also completely covering the gate 79 contacts as well as any exposed semiconductor material on the AlGaN surface 83. It will be understood, however, that the charge barrier layer 86 need not cover the entire spacer layer 84. A protective layer 88 in this embodiment entirely covers the charge barrier layer 86 to protect the device from ion diffusion.

The spacer layer 84 in the FET design optimizes the electronic properties of the surface 83. As indicated in FIG. 4, a field effect transistor 70 utilizing the invention herein may be a high electron mobility transistor with a two dimensional electron gas formed at the interface of a gallium nitride layer 71 under a layer of aluminum gallium nitride 72. As in the prior embodiments, the charge barrier layer 86 is preferably made of silicon dioxide, and the protective layer 88 comprises silicon nitride of the formula $Si_xN_y$. The spacer layer may be made of silicon nitride, aluminum nitride, or aluminum gallium nitride as described above.

As in the second embodiment, the spacer layer 84 may be extremely thin and still provide a protective coating to the semiconductor surface in accordance with the invention herein. The charge barrier layer 86 and the protective layer 88 may, therefore, be thicker than the spacer layer 84. The protective layer 88 is typically much thicker than the charge barrier layer 86. The layers are shown schematically in FIG. 4, and actual devices would have the relative thicknesses described above. The charge barrier layer 86 may be between about 5 and 200 nanometers in thickness. In some embodiments, the charge barrier layer 86 is about 100 nanometers thick. The spacer layer 84 may be between about 0.5 and about 5 nanometers thick.

The spacer layer 84, charge barrier layer 86, and protective layer 88 of the fourth embodiment are identical to that of the third embodiment. The $SiO_2$ charge barrier layer 86 is deposited by a method selected from the group consisting of plasma-enhanced chemical vapor deposition, low pressure chemical vapor deposition, and sputtering. The $Si_xN_y$ protective layer 88 may be deposited by plasma-enhanced chemical vapor deposition, low pressure chemical vapor deposition, or other conventional means. Again, the charge barrier layer may comprise silicon oxynitride as an alternative embodiment.

Figure 5:
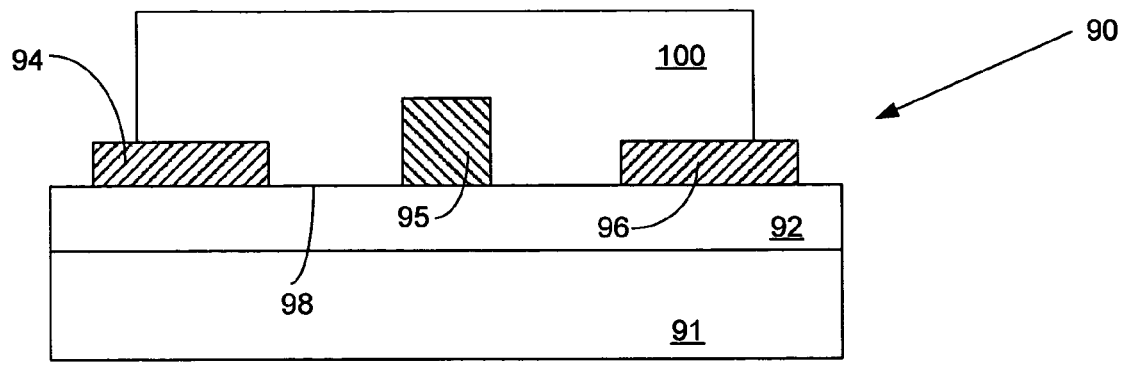
FIG. 5 is a cross sectional view of a field effect transistor formed in a layer of AlGaN on a layer of GaN with a layer of silicon oxynitride according to embodiments of the present invention.

FIG. 5 illustrates a further embodiment of the invention in the form of a field effect transistor 90, preferably a high electron mobility transistor, with typical source 94, gate 95, and drain 96 contacts. The device is fabricated in a layer of AlGaN 92 on an insulating layer of GaN 91. The embodiments illustrated in FIG. 5 include only one passivation layer comprising a silicon oxynitride barrier layer 100 covering a portion of the source 94 and drain contacts 96 and entirely covering the gate contact 95 as well as any exposed areas on the surface 98 of the AlGaN layer. Silicon oxynitride has a bandgap of 5 eV to 8 eV depending on the properties of the film. This bandgap is relatively high to reduce the number of electrons crossing the silicon oxynitride barrier and accumulating on or near the surface of the device or within the silicon oxynitride itself. The single silicon oxynitride layer of FIG. 5 serves as the charge barrier layer and the protective layer of the embodiments above. Although not illustrated in FIG. 5, the structure 90 may include a spacer layer as described above between the barrier layer 100 and the surface 98.

The embodiments described above have shown devices utilizing passivation structures in accordance with the invention in an advantageous manner. The invention herein also encompasses the methods disclosed for passivating Group III nitride semiconductor devices in accordance with this disclosure. In that regard, the inventors have developed a new and useful method of passivating semiconductor devices to reduce trapped charge at the surface of the semiconductor material or within the passivation layer itself.

In accordance with the above described embodiments, one passivation method disclosed herein includes forming a charge barrier layer on the surface of a Group III nitride semiconductor device to at least partially cover the exposed semiconductor material on the surface with a material having a relatively high bandgap to reduce the number of charge carriers accumulating on or near the surface or within the charge barrier layer. As noted with respect to the device aspects of the invention, the bandgap of the barrier layer is preferably higher than that of the Group III nitride and has a conduction band that is offset with respect to the conduction band of the Group III nitride. The method thereafter includes forming a protective layer having a relatively lower bandgap to entirely cover the charge barrier layer and to protect the semiconductor device from ion diffusion.

In one embodiment, the step of forming the charge barrier layer includes forming a layer of silicon dioxide on the surface of the semiconductor device and then forming a protective layer of silicon nitride on the silicon dioxide charge barrier layer. As noted above, the silicon nitride layer may be stoichiometric $Si_3N_4$ or non-stoichiometric silicon nitride.

In a different method embodiment, the charge barrier layer may be formed of a layer of silicon oxynitride on the surface of the semiconductor device.

Further embodiments of the invention herein include passivating the surface of a semiconductor device to reduce trapped charge at the surface or within the passivation layer, including forming a spacer layer on the surface of the semiconductor device to at least partially cover the exposed semiconductor material with a material having a high interface quality with the exposed semiconductor material to reduce the number of energy states present at the surface with a material. Next, the method includes forming a charge barrier layer on portions of the spacer layer to cover the spacer layer with a material of sufficient bandgap to reduce the number of carriers injected into the passivation. The method completes the passivation by forming a protective layer to entirely cover the charge barrier layer and to protect the semiconductor device from ion diffusion.

The step of forming the spacer layer may include forming a layer of silicon nitride on the surface of the semiconductor device. Alternatively, the spacer layer may be formed of a layer of aluminum nitride or aluminum gallium nitride on the surface of the semiconductor device. The charge barrier layer and the passivation layer may be formed of materials in accordance with the embodiments described above. Namely, the charge barrier layer may be composed of silicon dioxide or silicon oxynitride, and the passivation layer may be composed of silicon nitride. The layers may be deposited on the semiconductor to a desired thickness by conventional means, including plasma-enhanced chemical vapor deposition, low pressure chemical vapor deposition, or sputtering.

In the specification, there have been disclosed typical embodiments of the invention, and, although specific terms have been employed, they have been used in a generic and descriptive sense only and not for purposes of limitation, the scope of the invention being set forth in the following claims.

The invention claimed is:

1. A semiconductor device comprising:
   a layer of Group III nitride semiconductor material that includes at least one surface;
   a control contact on said surface for controlling the electrical response of said semiconductor material;
   an ohmic contact on said surface for providing a conductive path through the device;
   a dielectric barrier layer having a thickness between about 5 nm and about 200 nm covering said surface between said control contact and said ohmic contact, said dielectric barrier layer having a bandgap greater than the bandgap of said Group III nitride and a conduction band offset from the conduction band of said Group III nitride; and
   a dielectric protective layer covering said barrier layer, said dielectric protective layer having a bandgap narrower than the bandgap of said dielectric barrier layer and greater than the bandgap of said Group III nitride.

2. A semiconductor device according to claim 1 wherein said dielectric protective layer provides a physical and chemical barrier against moisture and oxygen.

3. A semiconductor device according to claim 1 wherein said dielectric barrier layer comprises silicon dioxide.

4. A semiconductor device according to claim 1 wherein said dielectric protective layer comprises silicon nitride.

5. A semiconductor device according to claim 4 wherein the silicon nitride is selected from the group consisting of stoichiometric $Si_3N_4$ and non-stoichiometric compositions of silicon nitride.

6. A semiconductor device according to claim 1 wherein said dielectric barrier layer comprises silicon oxynitride.

7. A semiconductor device according to claim 1 wherein said dielectric barrier layer comprises aluminum nitride.

8. A semiconductor device according to claim 1 wherein said dielectric barrier layer has a thickness of about 100 nm.

9. A semiconductor device according to claim 1 wherein said dielectric protective layer has a thickness of between about 100 and 2000 nm.

10. A semiconductor device according to claim 9 wherein said dielectric protective layer has a thickness of about 300 nm.

11. A semiconductor device according to claim 1 selected from the group consisting of Schottky diodes, field effect transistors, high electron mobility transistors, and metal-semiconductor-metal photodiodes.

12. A semiconductor device according to claim 1 further comprising a spacer layer interposed between said Group III nitride surface and said dielectric barrier layer for physically protecting said Group III nitride surface and for reducing surface charge accumulation.

13. A semiconductor device according to claim 12, wherein said spacer layer is characterized by an improved interface quality compared to an interface between said Group III nitride surface and said dielectric barrier layer.

14. A semiconductor device according to claim 12, wherein said spacer layer is characterized by an improved interface quality compared to an interface between said Group III nitride surface and said dielectric protective layer.

15. A semiconductor device according to claim 13 wherein the interface between said spacer layer and said Group III nitride surface is characterized by having fewer interface states than an interface between said Group III nitride surface and said dielectric barrier layer.

16. A semiconductor device according to claim 14 wherein the interface between said spacer layer and said Group III nitride surface is characterized by having fewer interface states than an interface between said Group III nitride surface and said dielectric protective layer.

17. A semiconductor structure according to claim 12 wherein said spacer layer has a thickness of between about 0.5 and 5 nm.

18. A semiconductor structure according to claim 12 wherein said spacer layer is selected from the group consisting of $Si_3N_4$, $Si_xN_y$, aluminum nitride and aluminum gallium nitride.

19. A semiconductor device comprising:
   a layer of Group III nitride semiconductor material that includes at least one surface;
   a control contact directly adjacent said surface for controlling the electrical response of said semiconductor material;
   an ohmic contact on said surface for providing a conductive path through the device;
   an aluminum nitride barrier layer covering said surface between said control contact and said ohmic contact, for providing a bandgap greater than the bandgap of said Group III nitride and a conduction band offset from the conduction band of said Group III nitride;
   a spacer layer interposed between said Group III nitride surface and said aluminum nitride barrier layer for physically protecting said Group III nitride surface and for reducing surface charge accumulation, said spacer layer at least partially covering the surface of said control contact; and
   a silicon nitride protective layer covering said barrier layer for providing a physical and chemical barrier against moisture, oxygen and related environmental attack.

20. A semiconductor device according to claim 19 wherein the silicon nitride is selected from the group consisting of stoichiometric $Si_3N_4$ and non-stoichiometric compositions of silicon nitride.

21. A semiconductor device according to claim 19 wherein said aluminum nitride barrier layer has a thickness between about 5 and 200 nm.

22. A semiconductor device according to claim 19 wherein said silicon nitride protective layer has a thickness between about 100 and 2000 nm.

23. A method of passivating a Group III nitride semiconductor device having a control contact and at least one ohmic contact, comprising:

covering the Group III nitride surface between the control contact and the ohmic contact with a dielectric barrier layer having a bandgap greater than the bandgap of the Group III nitride, a conduction band that is offset from the conduction band of the Group III nitride, and having a thickness between about 5 nm and about 200 nm; and forming a protective layer on said barrier layer from a dielectric material having a bandgap narrower than the bandgap of the barrier layer and that also provides a physical and chemical barrier against moisture and oxygen.

24. A method of passivating a Group III nitride semiconductor device according to claim 23 wherein the step of forming the barrier layer comprises forming a layer of silicon dioxide on the Group III nitride surface of the semiconductor device.

25. A method of passivating a Group III nitride semiconductor device according to claim 23 wherein the step of forming the protective layer comprises forming a layer of silicon nitride on the barrier layer.

26. A method of passivating a Group III nitride semiconductor device according to claim 25 wherein the step of forming a layer of silicon nitride comprises forming a layer selected from the group consisting of stoichiometric $Si_3N_4$ and non-stoichiometric silicon nitride.

27. A method of passivating a Group III nitride semiconductor device according to claim 23 wherein the step of forming the barrier layer comprises forming a layer of silicon oxynitride on the surface of the semiconductor device.

28. A method of passivating a Group III nitride semiconductor device according to claim 23, further comprising:
forming a spacer layer between the barrier layer and the surface of the semiconductor device, wherein said spacer layer has an improved interface quality with said surface compared to an interface between said barrier layer and said surface.

29. A method of passivating a Group III nitride semiconductor device according to claim 28 wherein the step of forming the spacer layer comprises forming a layer of silicon nitride on the surface of the semiconductor device.

30. A method of passivating a Group III nitride semiconductor device according to claim 28 wherein the step of forming the spacer layer comprises forming a layer of aluminum nitride or aluminum gallium nitride on the surface of the semiconductor device.

31. A method of passivating a Group III nitride semiconductor device according to claim 28 further comprising forming at least one metal contact on the surface.

32. A method of passivating a Group III nitride semiconductor device according to claim 31 wherein the step of forming the spacer layer is performed prior to formation of the at least one metal contact.

33. A semiconductor device according to claim 19, wherein said aluminum nitride barrier layer extends a distance of between about 0.25 and 5 microns from said control contact toward said ohmic contact.

34. A semiconductor device according to claim 21 wherein said aluminum nitride barrier layer has a thickness of about 100 nm.

35. A semiconductor device according to claim 22 wherein said silicon nitride protective layer has a thickness of about 300 nm.

36. A semiconductor device according to claim 19 selected from the group consisting of Schottky diodes, field effect transistors, high electron mobility transistors, and metal-semiconductor-metal photodiodes.

37. A semiconductor device according to claim 19, wherein said spacer layer is characterized by an improved interface quality compared to an interface between said Group III nitride surface and said aluminum nitride barrier layer.

38. A semiconductor device according to claim 19, wherein said spacer layer is characterized by an improved interface quality compared to an interface between said Group III nitride surface and said silicon nitride protective layer.

39. A semiconductor device according to claim 37 wherein the interface between said spacer layer and said Group III nitride surface is characterized by having fewer interface states than an interface between said Group III nitride surface and said aluminum nitride barrier layer.

40. A semiconductor device according to claim 38 wherein the interface between said spacer layer and said Group III nitride surface is characterized by having fewer interface states than an interface between said Group III nitride surface and said silicon nitride protective layer.

41. A semiconductor structure according to claim 19 wherein said spacer layer has a thickness of between about 0.5 and 5 nm.

42. A semiconductor structure according to claim 19 wherein said spacer layer is selected from the group consisting of $Si_3N_4$, $Si_xN_y$, aluminum nitride and aluminum gallium nitride.

43. A method of passivating a Group III nitride semiconductor device having a control contact and at least one ohmic contact that are both located directly adjacent semiconductor material in which electrical conduction occurs, comprising:
forming a spacer layer on the surface of the Group III nitride semiconductor device such that the spacer layer covers at least a portion of the surface of said control contact;

covering the spacer layer between the control contact and the ohmic contact with a dielectric barrier layer having a bandgap greater than the bandgap of the Group III nitride and a conduction band that is offset from the conduction band of the Group III nitride; and forming a protective layer on said barrier layer from a dielectric material having a bandgap narrower than the bandgap of the barrier layer and that also provides a physical and chemical barrier against moisture and oxygen.

44. A method of passivating a Group III nitride semiconductor device according to claim 43 wherein the step of forming the barrier layer comprises forming a layer of silicon dioxide on the spacer layer of the semiconductor device.

45. A method of passivating a Group III nitride semiconductor device according to claim 43 wherein the step of forming the protective layer comprises forming a layer of silicon nitride on the barrier layer.

46. A method of passivating a Group III nitride semiconductor device according to claim 45 wherein the step of forming a layer of silicon nitride comprises forming a layer selected from the group consisting of stoichiometric $Si_3N_4$ and non-stoichiometric silicon nitride.

47. A method of passivating a Group III nitride semiconductor device according to claim 43 wherein the step of forming the barrier layer comprises forming a layer of silicon oxynitride on the spacer layer of the semiconductor device.

48. A method of passivating a Group III nitride semiconductor device according to claim 43 wherein the step of forming the spacer layer comprises forming a layer of silicon nitride on the surface of the semiconductor device.

49. A method of passivating a Group III nitride semiconductor device according to claim 43 wherein the step of forming the spacer layer comprises forming a layer of aluminum nitride or aluminum gallium nitride on the surface of the semiconductor device.

* * * * *